United States Patent [19]

Taarning

[11] Patent Number: 4,698,719
[45] Date of Patent: Oct. 6, 1987

[54] PROTECTIVE TRIGGERING OF THYRISTORS IN A PULSE GENERATOR

[75] Inventor: Claus E. Taarning, Ballerup, Denmark

[73] Assignee: F. L. Smidth & Co. A/S, Copenhagen, Denmark

[21] Appl. No.: 897,293

[22] Filed: Aug. 15, 1986

[30] Foreign Application Priority Data

Aug. 19, 1985 [DK] Denmark .............................. 3747/85

[51] Int. Cl.$^4$ ............................................ H02H 3/093
[52] U.S. Cl. ...................................... 361/87; 361/100; 363/46
[58] Field of Search ........................ 361/18, 20, 21, 87, 361/93, 94, 2, 5, 8, 100, 235; 363/85, 86, 46, 45; 323/903

[56] References Cited

U.S. PATENT DOCUMENTS

| | | | |
|---|---|---|---|
| 3,456,125 | 7/1969 | Cousin et al. | 361/18 |
| 3,558,978 | 1/1971 | Nye, Jr. et al. | 361/87 X |
| 3,829,754 | 8/1974 | Rettig | 363/46 X |
| 3,925,709 | 12/1975 | Mitchell et al. | 361/18 X |
| 4,122,515 | 10/1978 | Tachibana et al. | 363/45 |
| 4,377,780 | 3/1983 | Björklund | 361/20 X |
| 4,393,345 | 7/1983 | Fork et al. | 361/20 X |
| 4,599,504 | 7/1986 | Ito | 363/46 X |
| 4,616,302 | 10/1986 | Mandelcorn | 361/18 X |
| 4,644,439 | 2/1987 | Taarning | 361/87 |

FOREIGN PATENT DOCUMENTS 3009102  9/1980  Fed. Rep. of Germany ........ 361/21

Primary Examiner—J. R. Scott
Assistant Examiner—A. Jonathan Wysocki
Attorney, Agent, or Firm—Brumbaugh, Graves, Donohue & Raymond

[57] ABSTRACT

A protective triggering system protects the thyristor switch element of a pulse generator circuit controlling a pulse operated electrostatic precipitator. The protective triggering is initiated for every pulse in the area around passage of the pulse current from positive to negative, its object being to supplement the spark-over released retriggering system so as to ensure that spark-overs occurring immediately after the current passage across zero do not cause renewed thyristor current in the absence of a triggering signal.

2 Claims, 3 Drawing Figures

PROTECTIVE TRIGGERING OF THYRISTORS IN A PULSE GENERATOR

BACKGROUND OF THE INVENTION

The invention relates to a method of and an apparatus (circuit) for protecting the thyristors of a pulse generator of a pulse operated electrostatic precipitator.

In a pulse operated electrostatic precipitator the voltage pulse is provided by triggering a switch element, usually a thyristor or a circuit consisting of series and-/or parallel coupled thyristors. When the pulse has reached its peak the current in the thyristors ceases as during the pulse decay, the current flows in return diodes which are coupled in parallel with the thyristors. Once the current in the thyristors has ceased for a certain period of time, the recovering time, they become non-conductive in their forward direction until they are retriggered to provide a new pulse.

If a spark-over occurs in the electrostatic precipitator after the current in the thyristors has ceased, but before the recovery time has elapsed, the thyristors will become forward biased and current will be drawn through the thyristors even though they are only partly conductive. In such a case the current is concentrated in separate, still partly conducting areas of the thyristor semi-conductor chips with the result that these are consequently overloaded and possibly damaged or destroyed.

Nos. EP-A-0066950 and EP-A-014522 describe methods by which retriggering of the thyristors of the pulse generator is established when spark-overs in the electrostatic precipitator are detected. Such a retriggering means that the thyristors can take over the current again without the danger of overload, provided that the retriggering signal has been established by the time the current shifts from the return diodes to the thyristors.

In the narrow interval of time from the moment that the current has shifted from the thyristors to the return diodes and for a few micro-seconds afterwards, due to unavoidable reaction times in the retriggering system, it is difficult to ensure that the retriggering signal can be established by the time that the current shifts back to the thyristors as a consequence of precipitator spark-over.

This is particularly so in extreme operating situations where a low voltage pulse height is used in the electrostatic precipitator simultaneously with use of a high DC voltage. Under these circumstances the time from the occurrence of the spark-over until the current will try to flow in the thyristors will be fractions of a micro-second.

As the time required for detecting the spark-over and generating the retriggering signal typically is one or two micro-seconds, the retriggering signal will consequently be too late.

SUMMARY OF THE INVENTION

The object of the invention is to provide a method and circuit which ensure that the entire critical area is covered by the protective triggering signal.

According to the present invention a protective triggering circuit for a thyristor switch element of a pulse generator is characterized by a high frequency current transformer, the primary winding of which is series-coupled with the pulse circuit of a pulse generator, and across the secondary winding of which is coupled a parallel resistance to provide a current-representing voltage signal thereacross; a peak value measuring unit in which the current-representing voltage peak value is measured a voltage divider for providing a signal proportional to the peak value signal; a voltage comparator in which the current representing voltage is compared with the signal proportional to the peak value, and the output signal of which is an indication that the peak value proportional signal exceeds the current representing voltage and a timer circuit, which is activated to provide a trigger signal by the voltage comparator output signal and an amplifier which transmits a trigger current to a connected cable ignition system.

The invention also includes a method of protecting the thyristor(s) of a pulse generator circuit controlling a pulse operated electrostatic precipitator, characterized in that the thyristors are fed with a trigger signal within the time interval covering the period from immediately before the pulse current shifts from the thyristors into the return diodes to an instant during the conductive interval of the return diodes, so that the trigger signal is fed to the thyristors in case the current suddenly changes direction due to an electrical sparkover in the electrostatic precipitator and tries to flow back into the thyristors, following the sparkover, so fast that a spark-over detecting and retriggering procedure has not yet been completed.

Every spark-over occurring during this interval will consequently result in the thyristors taking over the current without problems, as the protective triggering signal already has been established. If the spark-over occurs at an instant after the protective triggering has ceased, the current in the return diodes has reached such high value that the time from the spark-over until the current tries to shift from the return diodes to the thyristors is sufficiently long to establish the normal retriggering signal.

If no spark-over occurs during the pulse period, the protective triggering signal has no damaging effect, provided that the pulse duration has been chosen so that the time from the ceasing of the protective triggering signal and until the ceasing of the pulse is longer than the recovery time of the thyristors.

BRIEF DESCRIPTION OF THE DRAWINGS

The invention will now be described in more detail with reference to the accompanying drawings, in which.

DETAILED DESCRIPTION OF THE PREFERRED EMBODIMENTS

Figure 1:
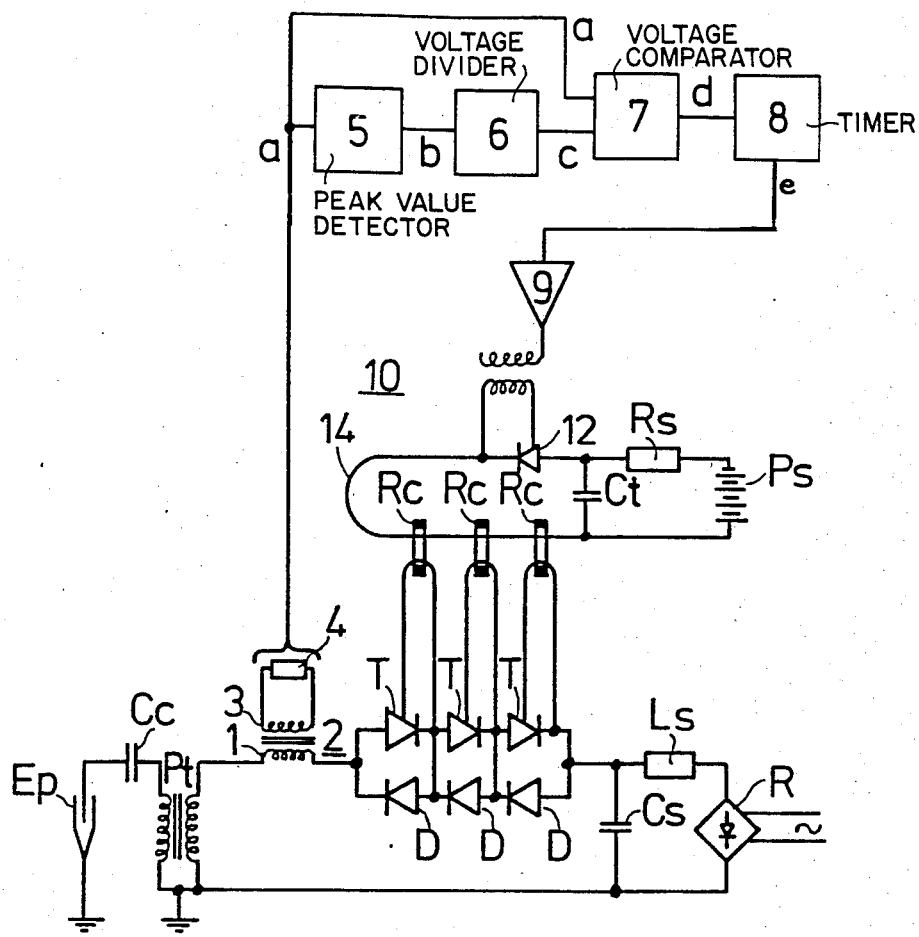
FIG. 1, in block diagram form, shows a protective triggering system.

FIG. 1 shows a pulse circuit comprising a rectifier system R converting an AC main into DC. The DC is led through a series inductance Ls for loading a storage capacitor Cs. The storage capacitor may be discharged to provide a pulse current through a pulse transformer Pt from the secondary winding of which a high tension pulse is led through a coupling condenser Cd to the emission electrode of an electrostatic precipitator Ep.

The discharge of the storage condenser is obtained through triggering the thyristors T in a column of anti-parallelly coupled thyristors T and diodes D. The use of such a column is necessitated by the fact that a single thyristor or diode cannot alone block for the voltage over the column. The column is here only shown schematically as it further comprises capcitors and resistances to distribute the voltage uniformly over the column.

To trigger all the thyristors in the column simultaneously a cable firing system 14 may be used. In such a system the trigger circuits of the thyristors are each coupled to a winding on an individual ring core transformer and a cable is led through all the ring cores. A pulse current through the cable will then induce trigger current in all the individual trigger circuits of the thyristors in the column.

In FIG. 1 is shown only the trigger system for an emergency firing system. A trigger condenser Ct charged from a DC power supply Ps through a series resistance Rs. When a thyristor 12 is triggered the condenser Ct is discharged through a cable passing through ring cores Rc and a trigger current is induced in the trigger circuits of the thyristors T.

FIG. 1 shows the primary winding 1 of a high frequency current transformer 2 coupled into the pulse circuit of a pulse generator (not shown). Consequently both the thyristor current and the return diode current flow therethrough. As a consequence a voltage will be generated across the secondary winding 3 which is loaded by a resistance 4, this voltage being proportional to the current in the pulse circuit. The voltage signal generated, calculated in relation to a fixed reference, is referred to as a. The polarity of the signal a has a positive value when current is passing through the thyristors and a negative value when current is passing through the return diodes.

The voltage signal a is passed to a peak value detector 5, the output signal b of which is set to equal the highest positive value of signal a. Prior to each new pulse it must be ensured that the signal b of the peak value detector has been reset to zero. This is most easily achieved by discharging the memory element of the peak value detector, which element is normally constituted by a capacitor, at a suitable time constant interval.

The signal b is passed to a voltage divider 6, which provides a signal c constituting a suitable fraction of signal b. Signal c is passed to one of the inputs of a voltage comparator, and signal a to the other.

The voltage comparator gives off a signal d when the value of signal c is larger than or equals that of signal a, and the signal d is passed to a timer circuit 8 adapted to give off a signal e for some time after a positive shift in signal d.

The signal e is passed to an amplifier circuit 9, to the output of which there is coupled a cable ignition system 10 which triggers the series and/or parallel coupled thyristors constituting the pulse generator switch element.

As well as being connected to the above described protective triggering system the cable ignition system is connected to the normal triggering system which starts the pulse and to the retriggering system which is actuated by the spark-over detection.

Figure 2:
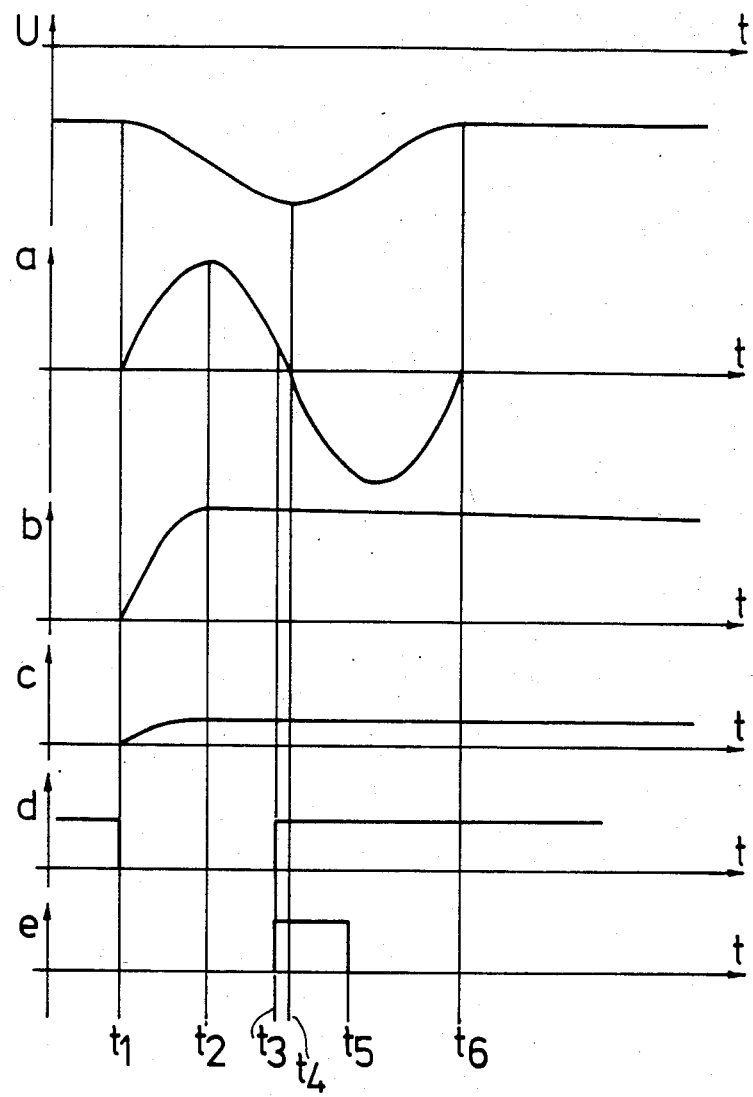
FIG. 2 shows the timing of the signals, in the system during a normal pulse; and, FIG. 3 shows the timing of the signals in the system during a spark-over.

FIG. 2 shows the timing of the signals a to e during a normal pulse. The figure further includes a depiction of the precipitator voltage U, indicating both the DC voltage level and the superimposed pulse voltage, the pulse starting at time $t_1$.

The signal a is the voltage signal representing the current in the pulse circuit and is effectively a sine wave signal. The signal b indicates substantially the highest positive peak value obtained by signal a. Once the peak value of a has been attained at $t_2$, the value of b gradually descends at a rate high enough to ensure that the value of b is close to zero before the next pulse is given off, but not so high that the value deviates significantly from the ideal peak value within the pulse period ($t_1$ to $t_6$).

Signal c is proportional to signal b, but with a value corresponding e.g. to one fifth of b. Signal d is a logical signal which is high for so long as signal c is higher than or equals signal a. Immediately following the instant $t_1$ signal c becomes lower than signal a, so that signal d is subsequently low.

At $t_3$ the signal a becomes lower than the signal c which at that instant has a size of e.g. one fifth of the peak value of a, which occurred at $t_2$.

As signal a substantially follows a sine curve, the occurrence at $t_3$ will happen at arc sine of one fifth, corresponding to 11.54° before a becomes zero which occurs at $t_4$.

When signal a at $t_3$ becomes lower than signal c, signal d immediately shifts to a high level, which entails also that signal e increases and remains high during the period $t_3$ to $t_5$. As the protective triggering signal is controlled by signal e it is seen that the protective triggering signal is established in the moment the current shifts from the thyristors into the return diodes at $t_4$. Thus it is ensured that complete protection exists in the entire critical area.

In the period from $t_5$ to $t_6$ the thyristors turn off and recover their hold-off strength, and at $t_6$ the pulse period ceases.

Figure 3:
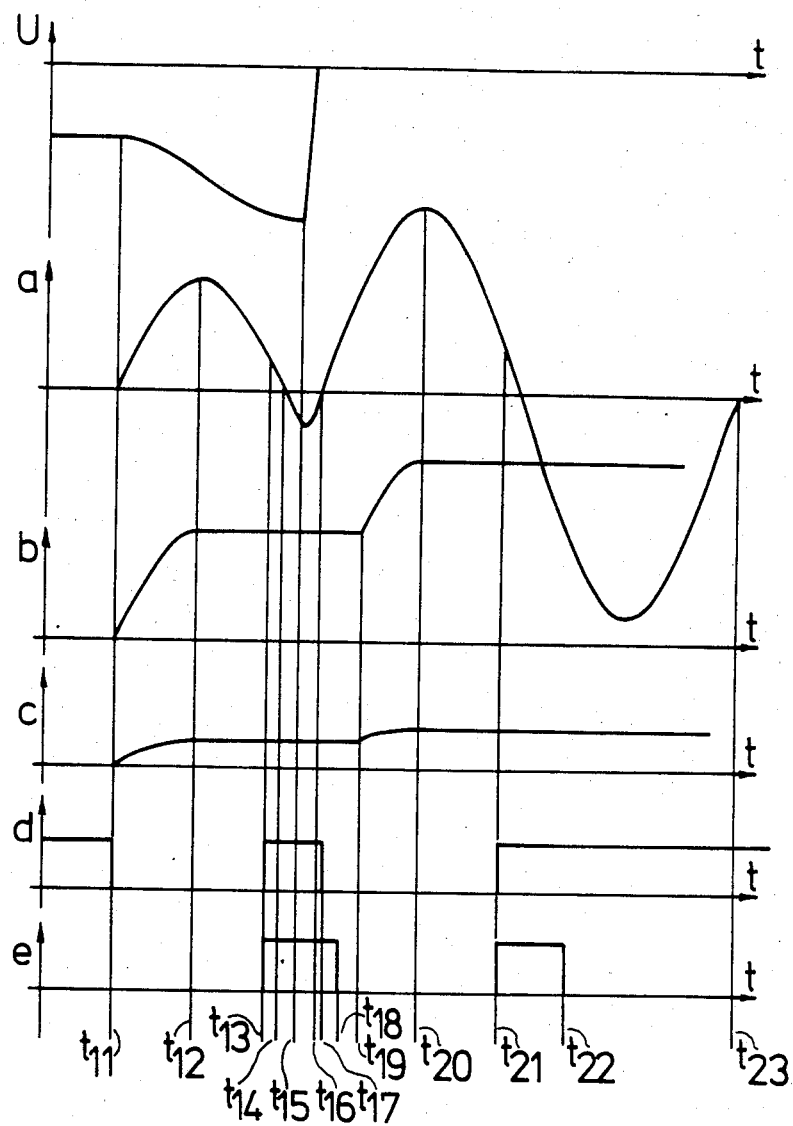

FIG. 3 shows the signal timing during a pulse during which a spark-over occurs. At $t_{11}$ the pulse is started, and signal a attains its peak value at $t_{12}$, which value is maintained in signal b. At $t_{13}$ signals a and c cross in value, and signal d is produced, as before, which again entails that signal e, which is a signal of measured duration, is produced. At $t_{14}$ the curve a crosses the zero value from positive to negative, reflecting that the current shifts from the thyristors into the return diodes.

A precipitator spark-over occurs at $t_{15}$, reflecting itself in the curve U, which approaches the zero line at a high rate.

At the same time the course of the signal a changes, as the curve starts to reapproach zero, which it reaches at $t_{16}$. At that instant the current shifts from the return diodes back to the thyristors, and it can be seen that signal e, which reflects the protective triggering signal formation, has already been established by the moment of shift so that the thyristors can take over the current without difficulty. At $t_{17}$ the value of signal a exceeds the value of signal c, which causes signal d to go low. At $t_{18}$ the time measuring signal e stops, and at $t_{19}$ signals a exceeds the peak value attained at $t_{12}$, which results in a further increase in signals b and c.

At $t_{20}$ signal a has attained its peak value, and at $t_{21}$ signals a and c cross each other, thus causing signal d to be produced which again causes the formation of signal e. Signal e is thus present in the interval $t_{21}$ to $t_{22}$, so that the protective triggering is again established in this interval.

In this interval the protective triggering is, however, unnecessary as renewed current shift cannot occur, but as it is not damaging either, it is not expedient to enhance the complexity of the electronics with a view to removing the protective triggering.

In the interval $t_{22}$ to $t_{23}$ the thyristors turn off and recover their hold-off strength, and at $t_{23}$ the spark over period ends.

I claim:

1. A triggering circuit which protects a thyristor switch element of a pulse generator, said pulse generator having a pulse circuit, said protective triggering circuit comprising:

a high frequency current transformer, said current transformer having a primary winding and a secondary winding, said primary winding being series-coupled with said pulse circuit of said pulse generator;

a resistance coupled in parallel across said secondary winding thereby to provide a current-representing voltage signal thereacross in use;

a peak value measuring unit which measures said current-representing voltage peak value;

a voltage divider connected to said peak-value measuring unit for providing a signal proportional to said peak-value signal;

a voltage comparator connected to said resistance and said voltage divider which compares said current representing voltage with said peak-value proportional signal, said comparator having an output to indicate whether or not said peak-value proportional signal exceeds said current representing voltage; and, a timer circuit connected to said comparator and having an output trigger signal activated by said voltage comparator output signal indicating said peak-value proportional signal exceeding said current representing voltage; and, an amplifier connected to said timer circuit to provide an output trigger current.

2. A method of protecting a thyristor of a pulse generator circuit, said pulse generator circuit controlling a pulse operated electrostatic precipitator, wherein said pulse generator circuit includes a return diode, the current in said circuit being shiftable between said thyristor and said return diode, said method comprising feeding said thyristor with a trigger signal within a time interval covering the period from immediately before said pulse current shifts from said thyristor into said return diode to an instant during the conductive interval of said return diode, whereby the thyristor will always be triggered to conduct in this period in case an electrical spark-over in said electrostatic precipitator causes said current to suddenly change direction and tries to reverse its flow towards the forward direction of the thyristor so quickly that a spark-over and retriggering procedure could not be completed before the thyristor becomes forward biased.

* * * * *